United States Patent [19]
Hamburgen

[11] Patent Number: 5,224,263
[45] Date of Patent: Jul. 6, 1993

[54] GENTLE PACKAGE EXTRACTION TOOL AND METHOD

[75] Inventor: William R. Hamburgen, Menlo Park, Calif.

[73] Assignee: Digital Equipment Corporation, Maynard, Mass.

[21] Appl. No.: 722,656

[22] Filed: Jun. 28, 1991

[51] Int. Cl.$^5$ .............................................. B23P 19/00
[52] U.S. Cl. ....................................... 29/762; 29/239
[58] Field of Search .............. 29/762, 764, 239, 281.6, 29/252

[56] References Cited

U.S. PATENT DOCUMENTS

| | | | |
|---|---|---|---|
| 3,390,446 | 7/1968 | Ettorre | 29/252 |
| 4,091,519 | 5/1978 | Durgan | 29/252 X |
| 4,894,910 | 1/1990 | Reimer et al. | 29/762 X |

Primary Examiner—Joseph M. Gorski
Attorney, Agent, or Firm—Flehr, Hohbach, Test, Albritton & Herbert

[57] ABSTRACT

A package extraction tool (10) removes package (12) from socket (14) of circuit board (16). The tool (10) consists of a cylinder (18) and a piston assembly (20). Port (24) that is used to evacuate the cylinder (18) after the piston (20) is inserted in, the cylinder (18). The piston assembly (20) splits symmetrically into two halves (26) and (28) along its major axis. On one end (32) of the piston (20), there is an undercut pocket (34) to grab around the edges (36) of the package (12) and seal on flat edge (38) of pin side (40) of the package (12). A small port (42) connects the two ends (32) and (33) of the piston (20) with a controlled leak. Piston (20) fits into the cylinder (18) with a slight clearance. Leakage is controlled by the piston (20)/cylinder (18) clearance. In use, the piston halves (26) and (28) are separated far enough to allow them to be reassembled around the package (12). The cylinder (18) is placed over the piston (20), and vacuum applied. The controlled leaks between the piston (20) and the cylinder (18) and between the two ends (32) and (33) of the piston are small enough that the piston (20) begins to move upward. When the undercut pocket (34) seats against the underside (40) of the package (12), a seal is initiated. The vacuum above the piston (20) increases, maintaining the seal at the package edges (36). When the combined upward forces at the edges (36) and on the body of the package (12) reach a critical value, the package pops loose.

15 Claims, 6 Drawing Sheets

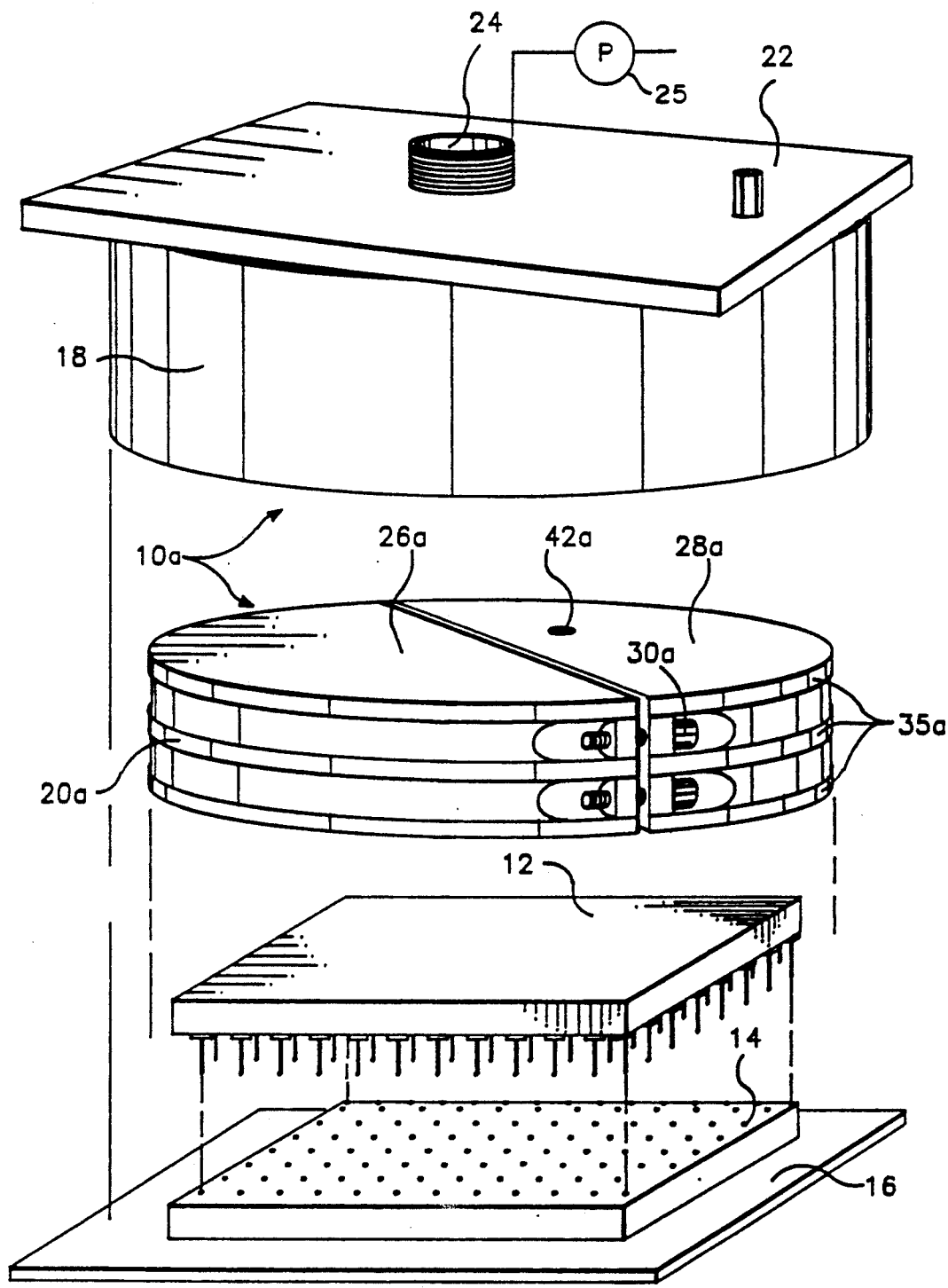
FIG.—3A

GENTLE PACKAGE EXTRACTION TOOL AND METHOD

BACKGROUND OF THE INVENTION

1. Field of the Invention

The present invention relates generally to a tool and method for extracting a high pin count electronic package or similar electronic module from a socket which engages the pins of the package with friction force. More particularly, it relates to such a tool and method which utilizes a combination of edge-applied force and vacuum force to remove the package from the socket. Most especially, the invention relates to such a tool and method in which the extraction force applied to the package scales upward proportionally to an increase in the number of connection pins of the package.

2. Description of the Prior Art

When an electronic package having, for example, several hundred connection pins extending from the package is in place in a socket on a printed circuit board with the pins held in their socket positions by friction, a considerable force is required to remove the package from the socket. A typical package of this type is referred to as a Pin Grid Array (PGA) package. The friction fit socket into which the pins of the PGA package are inserted is referred to as a non-Zero Insertion Force (ZIF) socket.

In conventional practice, when it is desired to remove a PGA package from its non-ZIF socket, a PGA extractor is used to grab the PGA package on its four edges to remove it from the socket. As package pin counts have increased to over 400, there has been an increased incidence of package breakage, due to the high stresses at the edges when sufficient force is applied to the edges of the package by the extractor to remove the package from the socket. The package breakage problem will get worse in the future, since the required extraction force scales as the number of pins, but the perimeter scales only as the square root of the number of pins.

Vacuum separation methods are used to separate boards comprising an electronic module in a Cray 2 computer. Vacuum grippers are used for many industrial and commercial applications, such as in the insertion and removal of automobile windshields. However, a vacuum applied force applied to an upper surface of an electronic package having a 100 mil (thousandths of an inch) grid of pins is insufficient for assuring removal of the pins from the socket. Assuming a hard vacuum of −14.7 psi, a lifting force of about 2.5 ounces per pin will be generated. However, depending on the particular non-ZIF socket a force of between about 2 ounces and a about 5 ounces per pin is required to assure package extraction.

SUMMARY OF THE INVENTION

The present invention addresses the problem of package breakage from excessive force applied at the edges of the package during removal of the package from its socket, by augmenting the edge force with a vacuum applied over the body of the package to distribute the extraction load more evenly. A tool for extracting an electronic package from a socket in accordance with this invention has a cylinder. As used herein, the term "cylinder" is used in its sense as a chamber in a pump, and is not meant to imply any limitation on geometric shape. The cylinder may have essentially any cross section shape, whether or not the shape includes any curved lines. A piston is free to move with respect to the cylinder. The piston has a first, end configured for releasable engagement of edges of the package. The cylinder has a first plenum between the piston and an end of the cylinder remote from the first end of the piston. The piston has a second plenum between the package and the piston when the first end of the piston is in engagement with the package. A passage communicates between the first plenum and the second plenum to provide a controlled gas flow between the second plenum and the first plenum. A vacuum pump is connected to said first plenum.

A method for extracting an electronic package having a plurality of pins from a socket having a like plurality of friction fit receptacles for the pins in accordance with the invention includes applying a lifting force to a lower edge of the package. A vacuum lifting force to is applied to an upper surface of the package. The combination of the lifting force and the vacuum lifting force is sufficient to remove the plurality of pins from the plurality of friction fit receptacles for the pins. The pins of the package are removed from the socket by the combination of the two forces.

The attainment of the foregoing and related advantages and features of the invention should be more readily apparent to those skilled in the art, after review of the following more detailed description of the invention, taken together with the drawings, in which:

BRIEF DESCRIPTION OF THE DRAWINGS

FIG. 3A is an exploded perspective view corresponding to that of FIG. 1, but of a second embodiment of a package extraction tool in accordance with the invention.

DETAILED DESCRIPTION OF THE INVENTION

Figure 1:
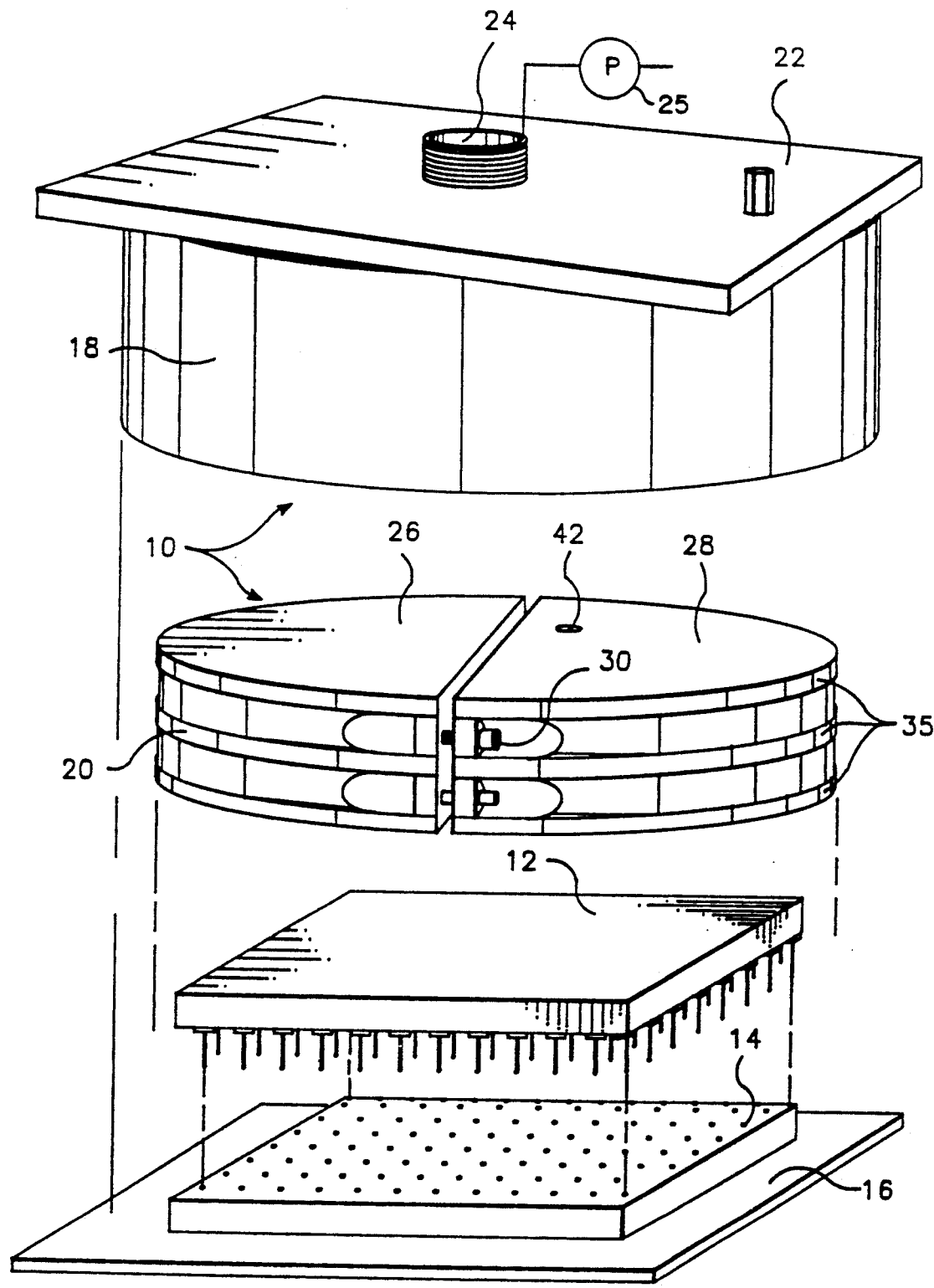
FIG. 1 is an exploded perspective of a package extraction tool in accordance with the invention.
Figure 2:
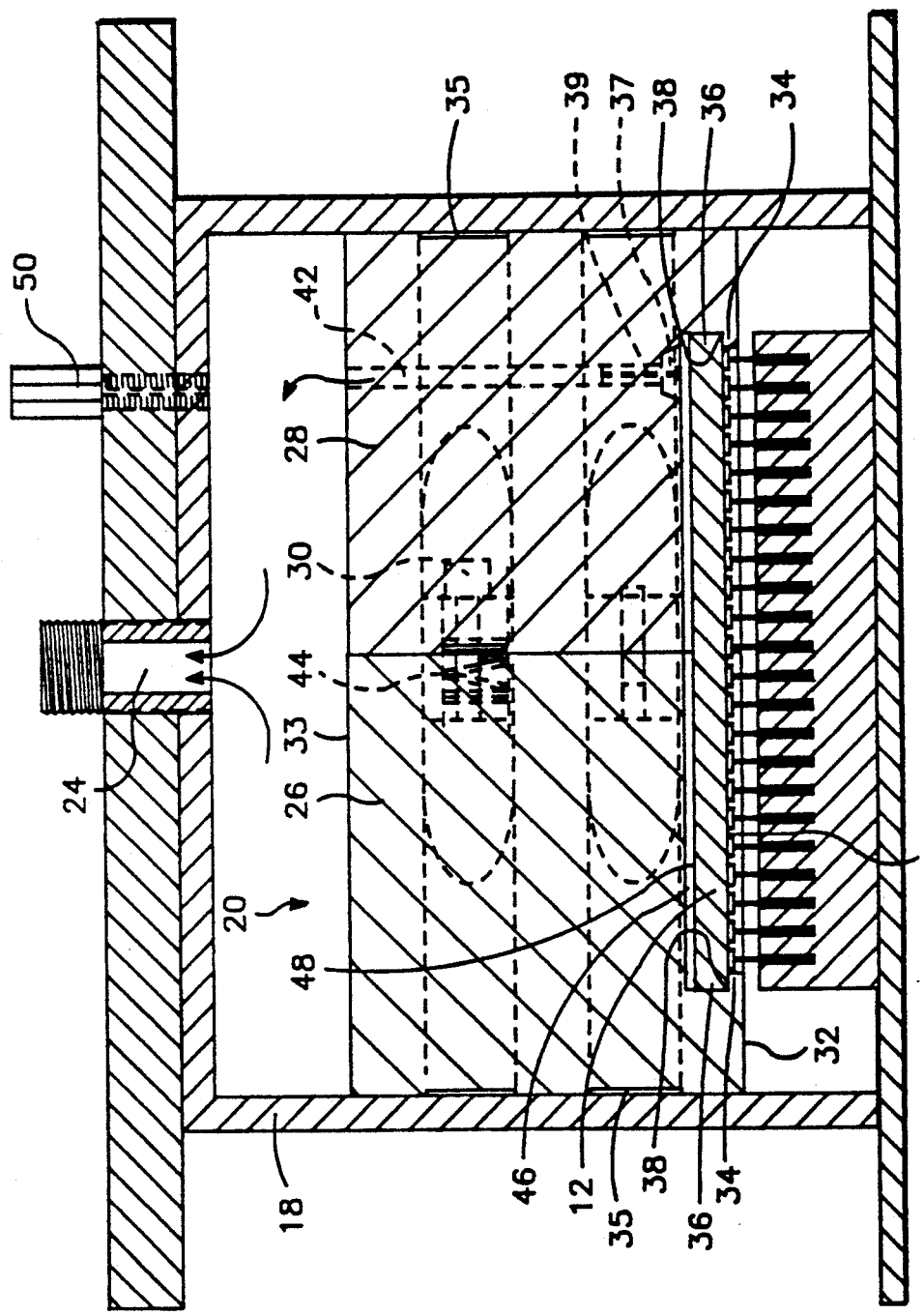
FIG. 2 is a cross-section view of the tool in FIG. 1.

Turning now to the drawings, more particularly to FIGS. 1-2, there is shown a package extraction tool 10 for removing PGA package 12 from socket 14 of circuit board 16. The tool 10 consists of two basic components: cylinder 18 and a piston assembly 20. The cylinder 18 has an inside diameter (or corresponding dimensions in the case of a non-circular cross-section piston) somewhat larger than the minimum necessary to accommodate the outline of the package 12. The cylinder 18 is closed at one end with a flat plate 22. The flat plate 22 has a port 24 that is used to evacuate the cylinder 18 after the piston 20 is inserted in the cylinder 18. A vacuum pump 25 is connected to the port 24 to evacuate the cylinder 18.

The piston assembly 20 splits symmetrically into two halves 26 and 28 along its major axis. The piston 20 is built as a matched assembly, and its outside diameter turned or machined while the two halves 26 and 28 are fastened together with bolts 30. Suitable clamps could be substituted for the bolts 30. This method insures the roundness of the outside diameter of the piston 20.

On one end 32 of the piston 20, there is an undercut pocket 34, designed to grab around the edges 36 of the package 12, and seal on flat edge 38 of pin side 40 of the package 12, as shown in FIG. 2. There is a small port 42 aligned with and offset from, the major axis of the piston 20 to connect the two ends 32 and 33 of the piston 20 with a controlled leak. Different screws 37 with different size central apertures 39 are inserted in the port 42 to control the rate of the leak.

The outside diameter of the piston 20 is dimensioned so that the piston 20 will fit into the cylinder 18 with a slight clearance. There are no seals; leakage is controlled by the piston 20/cylinder 18 clearance. The presence of grooves 35 on the outside surface of the piston reduces the leakage by making the fluid flow path between the piston 20 and the wall of the cylinder 18 more complex.

Figure 3:
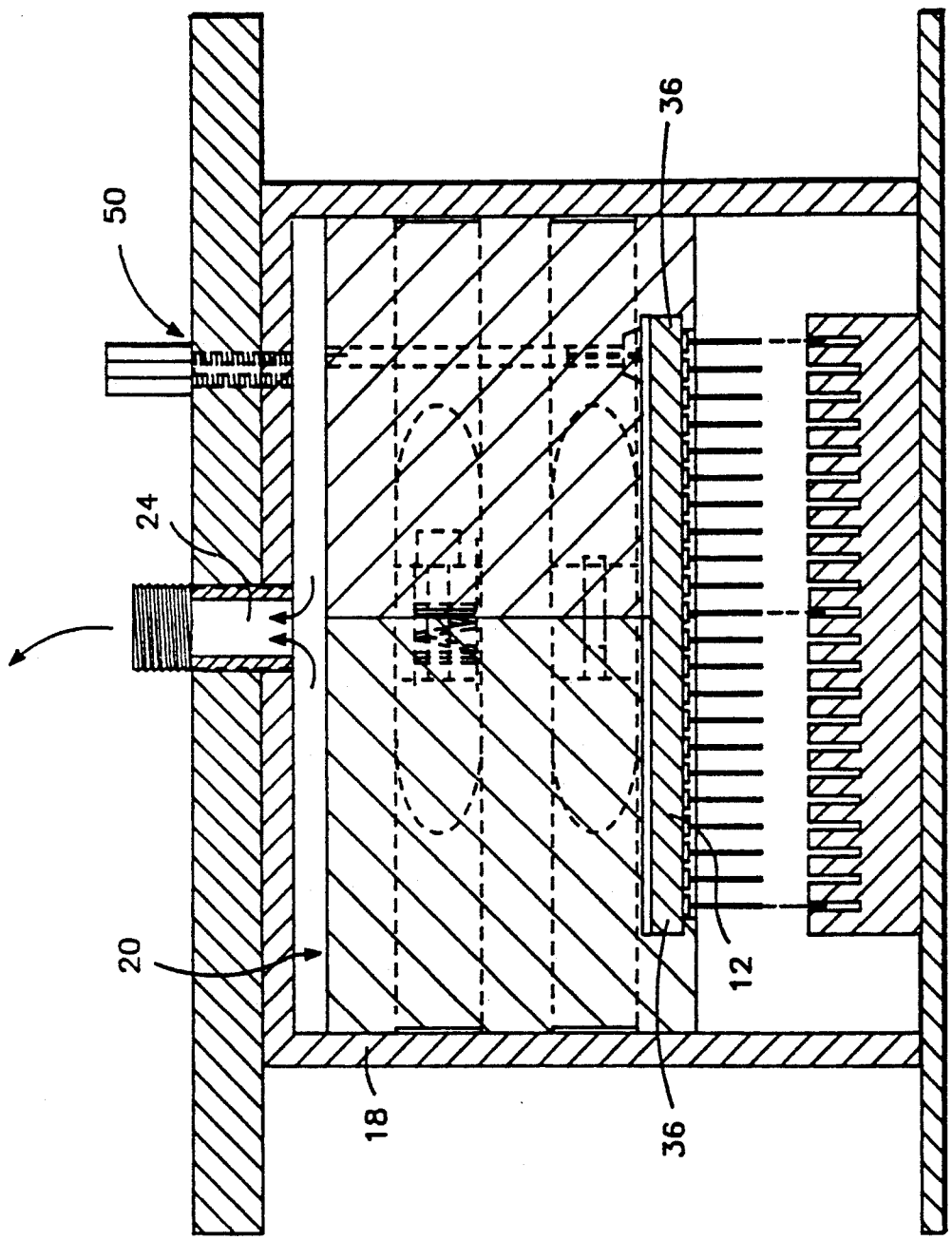
FIG. 3 is a cross section view similar to that of FIG. 2, but of the tool of FIGS. 1-2 at a different stage of operation.

In use, the piston halves 26 and 28 are separated far enough to allow them to be reassembled around the package 12. Springs 44 are compressed between the halves 26 and 28 to facilitate the separation when the bolts 30 are loosened. After the halves 26 and 28 are reassembled, the cylinder 18 is placed over the piston 20, and vacuum applied. The controlled leak between the piston 20 and the cylinder 18 and between the two ends 32 and 33 of the piston is small enough that the piston 20 begins to move upward. When the undercut pocket 34 seats against the underside 40 of the package 12 (see FIG. 2), a seal is initiated. At this point, the controlled leak between the ends 32 and 33 of the piston 20 can no longer draw air from the environment. The applied vacuum then begins to evacuate cavity 46 over top 48 of the package 12 and apply an upward force to the package 12. Since the vacuum supply port 24 now connects to a closed volume, the vacuum above the piston 20 increases, maintaining the seal at the package edges 36. When the combined upward forces at the edges 36 and on the body of the package 12 reach a critical value, the package pops loose, as shown in FIG. 3. A vacuum release port 50 allows the vacuum to be broken.

In the embodiment of FIG. 3A, package extraction tool 10A has a piston 20A with two piston halves 26A and 28A which are split along a diagonal of the rectangular package 12. The halves 26A and 28A are therefore moved apart at the diagonal for engaging and disengaging the package 12. Other than as shown and described, the construction and operation of the FIG. 23A embodiment of the invention is the same as that of the package extraction tool 10 in FIGS. 1-3.

Figure 4A:
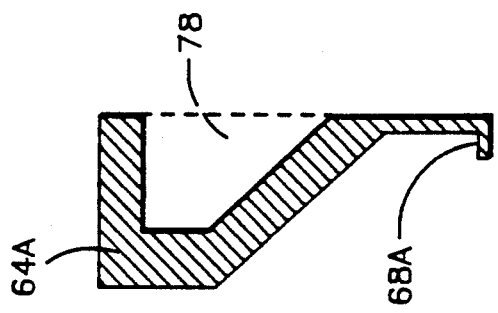
FIG. 4A is an alternative embodiment of a portion of the package extraction tool of FIG. 4.
Figure 4:
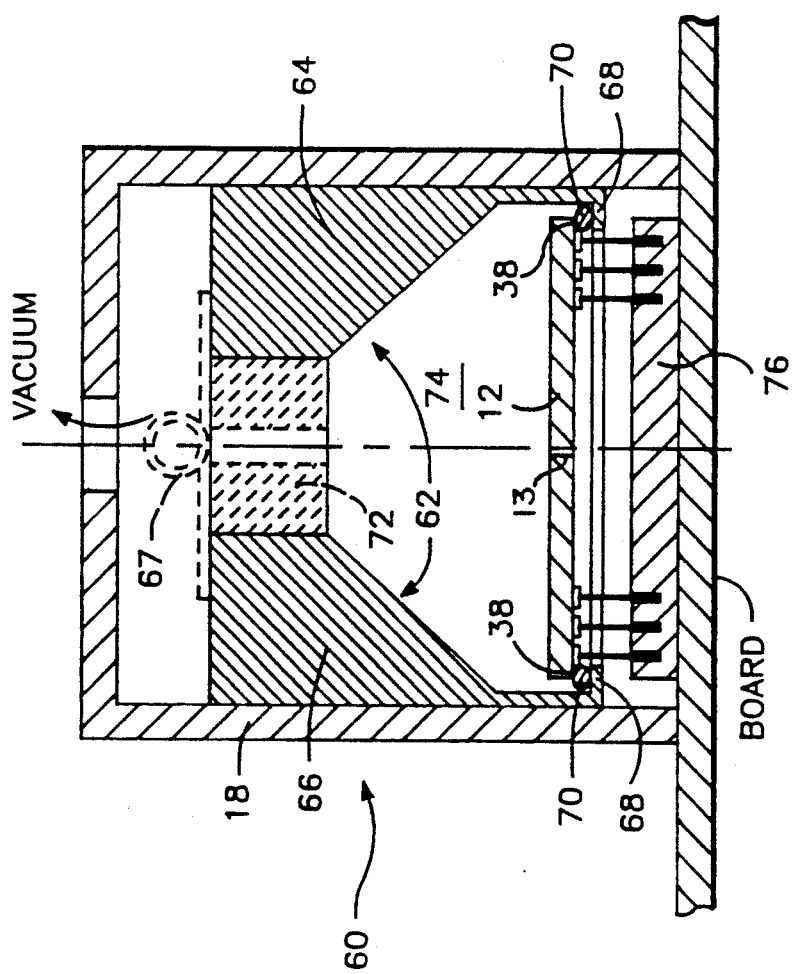
FIG. 4 is a cross section view of a third embodiment of a package extraction tool in accordance with the invention.

FIG. 4 shows another package extraction tool 60 having a cylinder 18 as in the FIGS. 1-3 embodiment. Piston 62 consists of right and left halves 64 and 66 joined together by a hinge 67. Undercut ends 68 of the piston halves 64 and 66 have an elastomeric or other resilient material pad 70 to facilitate forming a seal with bottom edge 38 of the package 12. Such a resilient pad 70 also helps to compensate for board to package parallelism errors. An optional flow restrictor 72 on each of the piston halves 64 and 66 serves to balance between edge forces on the package 12 produced by the piston halves moving upward in the cylinder 18 as vacuum is pulled, and vacuum force on the package 12 produced by the vacuum in the space 74 above the package 12 pulling on the package 12. The package 12 is oriented in the package extraction tool in a manner similar to that shown in the embodiment of FIG. 3A, so that a corner 13 of the package 12 is coincident with a projection of the pivot axis shown. The corner 13 is shown slightly to the left of the pivot axis for the sake of clarity. The right and left halves 64 and 66 therefore open and close along a diagonal of the package 12, comparable to the operation of the package extraction tool 10A of FIG. 3A.

In use the ends 68 of right and left piston halves 64 and 66 move outward as the piston halves 64 and 66 pivot on the hinge 67 to allow the ends 68 to extend over the package 12, then move together to engage the underside edge 38 of the package. The cylinder 18 is then placed over the piston halves 64 and 66 prior to pulling the vacuum to remove the package from socket 76. Other than as shown and described, the construction and operation of the FIG. 4 embodiment is the same as the FIG. 3A embodiment.

FIG. 4A shows an alternative form of piston half 64A, having a relief 78 to allow end 68A to move outward for moving over the package 12 without removing the piston half 64A completely from the cylinder 18.

Figure 5:
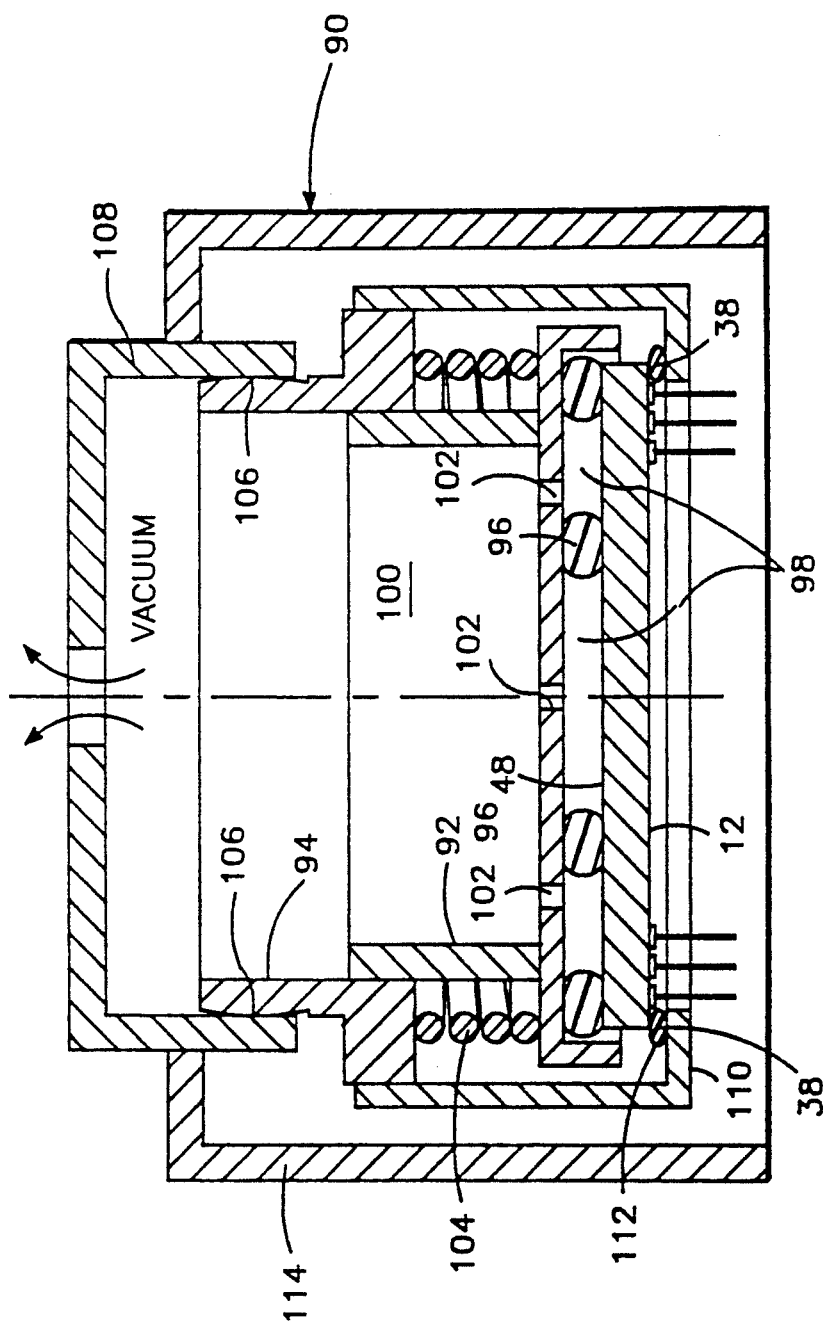
FIG. 5 is a cross section view of a fourth embodiment of a package extraction tool in accordance with the invention.

FIG. 5 shows another package extraction tool 90 incorporating dual pistons 92 and 94. The piston 92 seals against top 48 of the package 12, and the piston 94 engages the bottom edge 38 of the package 12 in the same manner as the pistons 20 and 62 of the FIGS. 1-4 extraction tools 10 and 60. A plurality of elastomeric or other resilient material seals 96 on the piston 92 engage the top 48 of the package, forming separate regions 98 between the top 48 and the piston 92. Each of the regions 98 is connected to space 100 above the piston 92 by a gas flow passage 102. Spring 104 biases piston 92 against the top 48 of the package 12 when piston 94 engages the lower edge 38 of the package 12. The piston 94 has a spherical sector surface 106 with a radius of the sphere matching the radius of the cylinder, which allows it to gimbal in cylinder 108 as end 110 engages lower edge 38 of the package 12. The extent of the sector surface 106 determines the amount of gimbaling motion that is available to compensate for package to board parallelism errors. A wider sector 106 allows a greater gimbaling motion, and a narrower sector 106, correspondingly less gimbaling motion. In fact, if the sector 106 is made sufficiently narrow, it need no longer have an accurately machined spherical surface to accommodate slight package to board parallelism errors. End 110 of the piston 94 also has resilient pad 112 for contacting the lower edge 38 of the package 12. Extension 114 of the cylinder 108 accommodates the piston 94 and allows outward movement of its halves to space them apart for movement over the package 12.

The use of two pistons 92 and 94 allows better control over the distribution of lifting force on the package 12 between the force applied to the lower edge 38 and the force applied to the upper surface 48 of the package. The other features of the tool 90 provide more complete compensation for board to package parallelism errors. Other than as shown and described, the construction and operation of the tool 90 is the same as that of the tools 10 and 60.

It should be apparent to those skilled in the art that various changes in form and details, of the invention as shown and described may be made. It is intended that such changes be included within the spirit and scope of the claims appended hereto.

What is claimed is:

1. A tool for extracting an electronic package having a plurality of pins from a socket having a like plurality of friction fit receptacles for the pins, which comprises a cylinder, a piston free to move with respect to said cylinder, said piston having a first end configured for releasable engagement of edges of the package, said cylinder having a first plenum between said piston and an end of said cylinder remote from the first end of said piston, said piston having a second plenum between the package and said piston when the first end of said piston is in engagement with the package, a passage communicating between said first plenum and said second plenum to provide a controlled gas flow between said second plenum and said first plenum, and a vacuum pump connected to said first plenum.

2. The tool for extracting an electronic package of claim 1 in which the first end of said piston is configured for releasable engagement of edges of the package by having an undercut shaped to grab around the edges of the package and seal on a flat edge of a pin side of the package.

3. The tool for extracting an electronic package of claim 2 in which said piston is further configured for releasable engagement of edges of the package by having first and second piston halves which are separable at the first end of said piston to fit over the package and which are movable together at the first end of said piston to engage the edges of the package.

4. The tool for extracting an electronic package of claim 3 in which the electronic package is rectangular and the first and second piston halves are separable along a diagonal extending between corners of the rectangular package.

5. The tool for extracting an electronic package of claim 4 in which said first and second piston halves are separable along the diagonal by parallel movement away from a longitudinal axis of said piston.

6. The tool for extracting an electronic package of claim 4 in which said first and second piston halves are separable along the diagonal by pivoting movement about a pivot at a second end of said piston remote from the first end of said piston.

7. The tool for extracting an electronic package of claim 1 in which said piston has an outside dimension such that said piston will fit inside said cylinder with a slight clearance.

8. The tool for extracting an electronic package of claim 1 in which said passage is provided in a gas flow restrictor positioned between first and second separable piston halves at a second end of said piston remote from the first end of said piston.

9. The tool for extracting an electronic package of claim 1 in which said piston has a spherical sector outside surface which allows said piston to gimbal in said cylinder.

10. A tool for extracting an electronic package having a plurality of pins from a socket having a like plurality of friction fit receptacles for the pins, which comprises a cylinder, a first piston free to move with respect to said cylinder, said first piston having a first end configured for releasable engagement of edges of the package, a second piston free to move with respect to said first piston, said second piston having a first end configured for releasable engagement of a top surface of the package, said cylinder having a first plenum between said first and second pistons and an end of said cylinder remote from the first ends of said first and second pistons, said second piston having a second plenum between the package and said second piston when the first end of said second piston is in engagement with the package, at least one passage communicating between said first plenum and said second plenum to provide a controlled gas flow between said second plenum and said first plenum, and a vacuum pump connected to said first plenum.

11. The tool for extracting an electronic package of claim 10 in which the first end of said first piston is configured for releasable engagement of edges of the package by having an undercut shaped to grab around the edges of the package and seal on a flat edge of a pin side of the package.

12. The tool for extracting an electronic package of claim 11 in which said first piston is further configured for releasable engagement of edges of the package by having first and second piston halves which are separable at the first end of said first piston to fit over the package and which are movable together at the first end of said first piston to engage the edges of the package.

13. The tool for extracting an electronic package of claim 12 in which the electronic package is rectangular and the first and second piston halves are separable along a diagonal extending between corners of the rectangular package.

14. The tool for extracting an electronic package of claim 10 in which said first piston has an outside dimension such that a second end of said first piston remote from the first end will fit inside said cylinder with a slight clearance.

15. The tool for extracting an electronic package of claim 10 in which said first piston has a spherical sector outside surface which allows said first piston to gimbal in said cylinder.

* * * * *